(12) United States Patent
Bourgeat

(10) Patent No.: US 11,887,982 B2
(45) Date of Patent: Jan. 30, 2024

(54) COMPACT PROTECTION DEVICE FOR PROTECTING AN INTEGRATED CIRCUIT AGAINST ELECTROSTATIC DISCHARGE

(71) Applicant: STMicroelectronics SA, Montrouge (FR)

(72) Inventor: Johan Bourgeat, Saint Pierre d'Allevard (FR)

(73) Assignee: STMicroelectronics SA, Montrouge (FR)

( * ) Notice: Subject to any disclaimer, the term of this patent is extended or adjusted under 35 U.S.C. 154(b) by 464 days.

(21) Appl. No.: 17/191,250

(22) Filed: Mar. 3, 2021

(65) Prior Publication Data

US 2021/0193648 A1    Jun. 24, 2021

Related U.S. Application Data

(62) Division of application No. 16/406,534, filed on May 8, 2019, now Pat. No. 10,971,489, which is a division
(Continued)

(30) Foreign Application Priority Data

Mar. 3, 2017  (FR) ........................ 1751731

(51) Int. Cl.
*H01L 27/02* (2006.01)
*H02H 9/04* (2006.01)
(Continued)

(52) U.S. Cl.
CPC ...... *H01L 27/0266* (2013.01); *H01L 27/0277* (2013.01); *H01L 27/0629* (2013.01); *H02H 9/046* (2013.01); *H01L 28/20* (2013.01)

(58) Field of Classification Search
CPC ............ H01L 27/0266; H01L 27/0277; H01L 27/0629; H02H 9/046
See application file for complete search history.

(56) References Cited

U.S. PATENT DOCUMENTS 5,883,540 A    3/1999  Kwon
6,249,410 B1   6/2001  Ker et al.
(Continued)

FOREIGN PATENT DOCUMENTS

FR    2747246 A1    10/1997
WO    2011089179 A1  7/2011

OTHER PUBLICATIONS

Galy, et al. "Ideal Gummel curves simulation of high current gain vertical BIMOS NPN transistor", Int. J. Electronics, 1996, vol. 80 No. 6, 717-726.
(Continued)

*Primary Examiner* — David A Zarneke
(74) *Attorney, Agent, or Firm* — Crowe & Dunlevy

(57) ABSTRACT

An integrated circuit includes a power supply terminal, a reference terminal, and a signal terminal. A first protection device is coupled between the signal terminal and the power supply terminal, the first protection device including a first MOS transistor. A second protection device is coupled between the signal terminal and the reference terminal, the second protection device including a second MOS transistor. Gates of the MOS transistors are directly or indirectly coupled to the reference terminal. Substrates of the MOS transistors are coupled to the reference terminal via a common resistor.

20 Claims, 4 Drawing Sheets

Related U.S. Application Data of application No. 15/694,403, filed on Sep. 1, 2017, now Pat. No. 10,340,265.

(51) Int. Cl.
*H01L 27/06* (2006.01)
*H01L 49/02* (2006.01)

(56) References Cited

U.S. PATENT DOCUMENTS

| | | |
|---|---|---|
| 8,598,938 B2 | 12/2013 | Galy et al. |
| 9,054,793 B2 | 6/2015 | Cook et al. |
| 2003/0223166 A1 | 12/2003 | Chen et al. |
| 2004/0257728 A1 | 12/2004 | Hu |
| 2009/0040668 A1 | 2/2009 | Chen et al. |
| 2009/0086393 A1 | 4/2009 | Watanabe |
| 2010/0148267 A1 | 6/2010 | Arai et al. |
| 2011/0006342 A1 | 1/2011 | Lee et al. |
| 2013/0120049 A1 | 5/2013 | Galy et al. |
| 2013/0141824 A1 | 6/2013 | Bourgeat et al. |

OTHER PUBLICATIONS

NPI Search Report and Written Opinion for FR 1751731 dated Oct. 31, 2017 (7 pages).
EP Search Report and Written Opinion for E 17186784.9 dated Feb. 20, 2018 (7 pages).

COMPACT PROTECTION DEVICE FOR PROTECTING AN INTEGRATED CIRCUIT AGAINST ELECTROSTATIC DISCHARGE

CROSS REFERENCE TO RELATED APPLICATIONS

This application is a divisional of United States Application for patent Ser. No. 16/406,534, filed May 8, 2019, which is a divisional of U.S. patent application Ser. No. 15/694,403, filed Sep. 1, 2017, now U.S. Pat. No. 10,340,265, which claims the priority benefit of French Application for Patent No. 1751731, filed on Mar. 3, 2017, the disclosures of which are hereby incorporated by reference in their entireties to the maximum extent allowable by law.

TECHNICAL FIELD

Embodiments relate to electronic devices, and notably those intended for the protection of components against electrostatic discharge (ESD: ElectroStatic Discharge).

BACKGROUND

In the field of microelectronics, an electrostatic discharge may occur at any time throughout the service life of an integrated circuit, and constitute a real problem for the reliability of the electronic components or modules of this integrated circuit, as well as a major cause of failure.

An electrostatic discharge generally results in a current peak varying in size (amplitude, magnitude) and brevity (time) between two terminals of an electronic module of the integrated circuit.

For an electrostatic discharge to take place, it is necessary that a first terminal of the module receives the discharge, e.g. on contact with an electrically charged body, and that a second terminal acts as a ground, e.g. by being in contact with a metal object.

Usually, an electrostatic discharge takes place when the integrated circuit is powered off, between two terminals from among the power supply terminal, the reference terminal, or one of the signal terminals, coupled to said module.

An ESD protection device is aimed at absorbing this current peak as much as possible in order to prevent it from flowing into the module, or a possible surge at the module's terminals.

There are various protections against electrostatic discharge, notably MOS hybrid operation transistors.

Hybrid operation transistors are MOS transistors comprising a parasitic bipolar transistor the operation of which involves an operation of this bipolar transistor and an operation of the MOS transistor in a sub-threshold mode.

The principle of a hybrid operation of a MOS transistor has been highlighted in the article by Galy, et al. "Ideal Gummel curves simulation of high current gain vertical BIMOS NPN transistor", INT. J. ELECTRONICS, 1996, vol. 80 No. 6, 717-726 (incorporated by reference). This article is a theoretical study carried out on a vertical structure transistor having a gate length (channel length) of the order of a micron and validated by simulations, without any application of such a hybrid operation being mentioned.

Such a MOS hybrid operation transistor notably has the advantage of being resistant to ionizing radiation and it may generally be employed for mass consumer, space or military applications, in the digital and analogue fields.

The use of such a component in the context of the protection of circuits against electrostatic discharge has notably been described in International Patent Application No. WO 2011 089179 (and its U.S. equivalent patent publication 2013/0141824).

However, some ESD protection devices described in this international application may, in some cases, present some drawbacks. It has notably been observed that when the device is coupled between a signal terminal (input/output terminal) and a power supply terminal of the integrated circuit, and the environment of the integrated circuit is not correctly controlled, it is liable to be triggered during the operation of the integrated circuit (therefore in the absence of any electrostatic discharge), e.g. when the potential difference between the power supply terminal and the signal terminal is greater than or equal to the trigger threshold of the protection device.

This is liable to damage at least one part of the integrated circuit and/or generate operating errors.

There is, moreover, a need to reduce as much as possible the surface occupied by the protection device, in particular when it is distributed over the different signal terminals coupled to different electronic components or modules of the integrated circuit.

SUMMARY

According to one embodiment, an electronic device is provided that is capable of protecting an electronic component or module of an integrated circuit against electrostatic discharge occurring between any pair of terminals coupled to said component or module of an integrated circuit, and having a reduced footprint.

According to one aspect, an integrated circuit is provided, comprising: a power supply terminal intended to receive a power supply voltage, a reference terminal intended to receive a reference voltage, e.g. the ground, and at least one signal terminal intended to receive/transmit a signal, a first protection device coupled between said at least one signal terminal and the power supply terminal, at least one second protection device coupled between said at least one signal terminal and the reference terminal.

According to this aspect, the first protection device includes: a first MOS transistor a first electrode of which is coupled to said at least one signal terminal, a second electrode coupled to the power supply terminal, said at least one second protection device comprises a second MOS transistor a first electrode of which is coupled to said at least one signal terminal and a second electrode is coupled to the reference terminal, the gates of the first and second MOS transistors being directly or indirectly coupled to the reference terminal, and the substrate of the first and second transistors being coupled to the reference terminal via a common resistor.

Thus, an electronic component or module coupled to these three terminals is protected against electrostatic discharge occurring between the signal terminal and one or other of the reference and power supply terminals, and the connection of the substrate and the gate of the first transistor to a different terminal from the signal terminal advantageously makes it possible, when the integrated circuit is in operation, to prevent the gate of the first transistor from being polarized and the first transistor being triggered, i.e. switched on.

The gates of the first and second transistors may be directly coupled to the reference terminal, i.e. by a connection not involving any active or passive intermediate component, but only elements the only function of which is to transmit the signal, e.g. metal tracks, vias, etc.

As a variant, the gates of the first and second MOS transistors may be coupled to the reference terminal via a first trigger circuit, resulting therefore in an indirect coupling.

The first trigger circuit may be of any conventional structure and comprise, for example, another resistor connected between the gates of the first and second MOS transistors and the reference terminal, without any mutual connection between the gate and the substrate of each transistor.

However, it is more efficient for the first trigger circuit to comprise said common resistor.

Thus, the gate and the substrate of each MOS transistor are linked by this indirect coupling and the MOS transistor is in a configuration compatible with a hybrid operation of the type mentioned above.

According to one embodiment, the integrated circuit comprises a third protection device coupled between the power supply terminal and the reference terminal and including a third MOS transistor a first electrode of which is coupled to the power supply terminal and a second electrode is coupled to the reference terminal, and the gate of which is directly coupled to the reference terminal and the substrate is coupled to the reference terminal via the common resistor.

Thus, the integrated circuit is protected against electrostatic discharge flowing between the power supply terminal and the reference terminal.

According to another embodiment, the third MOS transistor a first electrode of which is coupled to the power supply terminal and a second electrode is coupled to the reference terminal, has its substrate coupled to the reference terminal via the common resistor, and its gate coupled to the reference terminal via a second trigger circuit.

Here again for reasons of efficiency, the second trigger circuit may comprise the common resistor.

Thus, here again the third protection device is compatible with the hybrid operation transistors, making it possible to improve the triggering of the protection devices.

According to one embodiment, the integrated circuit includes a first signal terminal and at least one second signal terminal, and at least one fourth protection device coupled between the first signal terminal and the second signal terminal and including a fourth MOS transistor a first electrode of which is coupled to the first signal terminal, a second electrode is coupled to the second signal terminal, the gate of which is directly coupled to the reference terminal, and the substrate of which is coupled to the reference terminal via the common resistor.

According to another embodiment, the fourth MOS transistor of this fourth protection device has its substrate coupled to the reference terminal via the common resistor, and its gate coupled to the reference terminal via a third trigger circuit.

The third trigger circuit may here again comprise the common resistor.

The transistors may be implemented in one and the same substrate and have mutually connected gates.

This notably makes it possible to have a more compact device.

BRIEF DESCRIPTION OF THE DRAWINGS

Other advantages and features of the invention will appear on examining the detailed description of embodiments of the invention, in no way restrictive, and the accompanying drawings in which.

DETAILED DESCRIPTION

Figure 1:
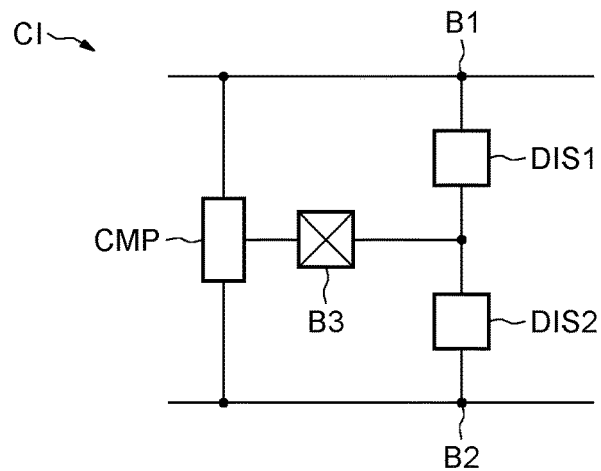
FIG. 1 is a schematic diagram of an electronic integrated circuit including electronic protection devices.

In FIG. 1, the references DIS1 and DIS2 designate electronic protection devices for protecting at least one electronic component or module CMP of an electronic integrated circuit CI against electrostatic discharge (ESD according to an abbreviation well known to the person skilled in the art).

The electronic circuit CI comprises a power supply terminal B1, a reference terminal B2 and a signal terminal B3, and the component CMP is coupled to each of these three terminals B1, B2, and B3.

As a guide, when the electronic circuit is in operation, the power supply terminal B1 may receive a power supply signal, e.g. a positive voltage, the terminal B2 may receive a reference signal, e.g. a constant negative voltage or a zero (ground) voltage.

The signal terminal B3 may receive or transmit a data signal from or to the module CMP.

When the circuit CI is not in operation, the circuit CI may be subject to electrostatic discharge flowing between one or other of these terminals.

An electrostatic discharge usually results in a very short current pulse (e.g. a few microseconds) the amplitude of which is, for example, of the order of 2 amperes and typically occurs at the end of 10 nanoseconds.

This corresponds, for example, to a pulse potential difference applied between two terminals of the circuit CI through an R-L-C equivalent circuit, the peak voltage of which occurs at the end of 10 nanoseconds with an intensity of 1 to 4 kvolts HBM, e.g. 4 kvolts HBM for 2.5 amperes.

It is recalled here that the letters HBM are the abbreviation for "Human Body Model" well known to the person skilled in the art in the field of protection against electrostatic discharge and notably designate an electrical circuit aimed at modeling an electrostatic discharge delivered by a human being and usually used for testing the sensitivity of devices to electrostatic discharge. This HBM electrical circuit, which is the R-L-C equivalent circuit referred to above and to which a high voltage is applied, notably comprises a 100 pF capacitor which discharges through a 1.5 kilohm resistor in the device to be tested. Thus, in the present case, an electrostatic discharge of 4 kilovolts HBM means that a potential difference of 4 kilovolts is applied to the HBM electrical circuit.

Then it is advisable that this current pulse should flow through one of the protection devices DIS1 and DIS2 and not through the component CMP.

The devices DIS1 and DIS2 are consequently aimed at absorbing these current pulses occurring respectively between the power supply terminal B1 and the signal terminal B3, and between the reference terminal B2 and the signal terminal B3, or between the two terminals B1 and B2.

Figure 2:
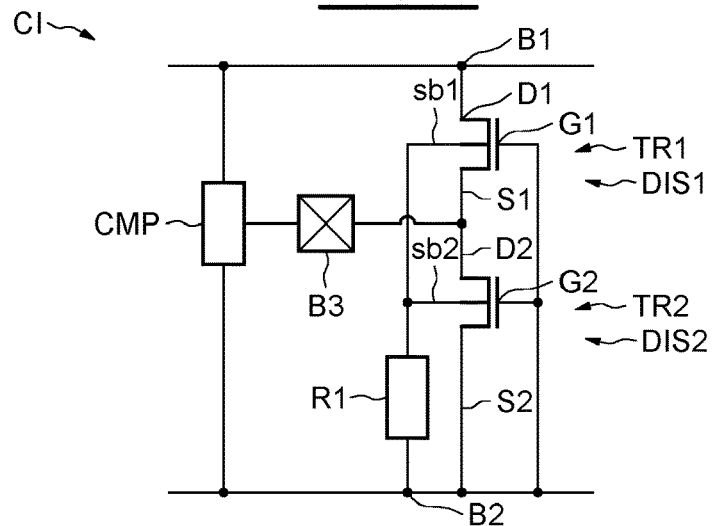
FIGS. 2 and 3 are schematic diagrams showing details of the electronic protection devices in FIG. 1.

As illustrated in FIG. 2, the devices DIS1 and DIS2 respectively include a first MOS transistor TR1 and a second MOS transistor TR2, mounted in series between the power supply terminal B1 and the reference terminal B2.

The drain D1 of the first transistor TR1 is coupled to the power supply terminal B1, the source S1 of the first transistor TR1 is coupled to the signal terminal B3 and to the drain D2 of the second transistor TR2, and the source S2 of the second transistor TR2 is coupled to the reference terminal B2.

The gate G1 of the first transistor TR1 and the gate G2 of the second transistor TR2 are directly coupled to the reference terminal B2.

A connection or a direct coupling is understood here as being a connection not involving any active or passive intermediate component, but only elements the only function of which is to transmit the signal, e.g. metal tracks, vias, etc.

The first transistor TR1 is thus in a configuration commonly designated by the person skilled in the art by the abbreviation "GGNMOS" (for Gate Grounded NMOS).

The substrate sb1 of the first transistor TR1 and the substrate sb2 of the second transistor TR2 are coupled here to the reference terminal B2, via a common resistor R1. For transistor threshold voltages of the order of 4 volts, the common resistor R1 in this embodiment has a resistive value of 500 ohms.

However, according to the envisaged application, it would be possible to choose another resistance value.

In practice, the first transistor TR1 and the second transistor TR2 are implemented on one and the same substrate, as will be seen below.

In the presence of an electrostatic discharge flowing from the power supply terminal B1 to the signal terminal B3, the voltage generated by the electrostatic discharge increases until it reaches the breakdown voltage of the drain-substrate junction of the first transistor TR1.

The substrate sb1, which corresponds here to the base of the parasitic bipolar transistor of the first MOS transistor TR1, is therefore polarized and the parasitic bipolar transistor (and therefore the first MOS transistor TR1) is switched on.

As a guide, the transistor TR1 is triggered here when the voltage at its terminals reaches 4.5 volts.

When the discharge flows in the other direction, i.e. from the signal terminal B3 to the power supply terminal B1, the voltage generated by the electrostatic discharge increases until it reaches the breakdown voltage of the drain-substrate junction of the first transistor TR1.

The substrate sb1, which corresponds here to the base of the parasitic bipolar transistor of the first MOS transistor TR1, is therefore polarized and the parasitic bipolar transistor (and therefore the first MOS transistor TR1) is switched on.

In this case, the triggering of the device DIS1 is more progressive, i.e. for a voltage value at its terminals of less than 2.5 volts, the current intensity through the device DIS1 increases linearly, and beyond 2.5 volts, the intensity of the current passing through the first device DIS1 increases exponentially, while the voltage at the terminals of the first transistor TR1 approaches 3.5 volts asymptotically.

When the discharge flows from the signal terminal B3 to the reference terminal B2, the voltage generated by the electrostatic discharge increases until it reaches the breakdown voltage of the drain-substrate junction of the second transistor TR2.

The substrate sb2, which corresponds here to the base of the parasitic bipolar transistor of the second MOS transistor TR2, is therefore polarized and the parasitic bipolar transistor (and therefore the second MOS transistor TR2) is switched on.

The second transistor TR2 has a GGNMOS type configuration, and the reference terminal B2 to which its gate G2 and its substrate sb2 are connected acts as a ground.

The second transistor TR2 is triggered here for a voltage at its terminals equal to 4.2 volts.

When the discharge flows from the reference terminal B2 to the signal terminal B3, the pulse is transmitted by the common resistor R1 onto the substrate sb2 of the second transistor TR2 and by the direct connection onto the gate G2 of the MOS transistor TR2. In this scenario, the second transistor TR2 is triggered in the usual way, as soon as its gate-source voltage exceeds its threshold voltage.

The polarization of the substrate sb2 makes it possible to lower the threshold voltage of the second transistor TR2. Here, the transistor is triggered for a voltage of 0.6 volts.

In the case of a current pulse flowing from the power supply terminal B1 to the reference terminal B2, the voltage generated by the electrostatic discharge increases until it reaches the breakdown voltage of the drain-substrate junction of the first transistor TR1.

The substrate sb1, which corresponds here to the base of the parasitic bipolar transistor of the first MOS transistor TR1, is therefore polarized and the parasitic bipolar transistor of the first MOS transistor TR1 is switched on.

The substrate sb2 of the second MOS transistor TR2 is also polarized owing to the connection between the substrates sb1 and sb2, and the parasitic bipolar transistor of the second MOS transistor TR2 is also switched on.

The first MOS transistor TR1 and the second transistor TR2 are then triggered for a voltage between the terminals B1 and B2 with a value of 4.2 volts.

In the case of a discharge flowing between the reference terminal B2 and the power supply terminal B1, the discharge is transmitted simultaneously onto the gate G1 of the first transistor TR1, onto the gate G2 of the second transistor TR2, onto the substrate sb1 of the first transistor TR1 and onto the substrate sb2 of the second transistor TR2.

The two transistors TR1 and TR2 are therefore triggered in the usual way in order to facilitate the flow of the electrostatic discharge.

Thus, the component CMP is protected against electrostatic discharge that may occur between any two of its three terminals B1, B2 and B3.

And, the connection of the substrate sb1 and of the gate G1 of the first transistor TR1 to a reference terminal B2, i.e. to a different terminal from the signal terminal B3, makes it possible, when the device is in operation and, for example, the potential difference between the power supply terminal and the signal terminal is above the trigger threshold of the transistor TR1, to prevent the gate G1 of the first transistor TR1 from being polarized and the first transistor TR1 being triggered.

Figure 3:
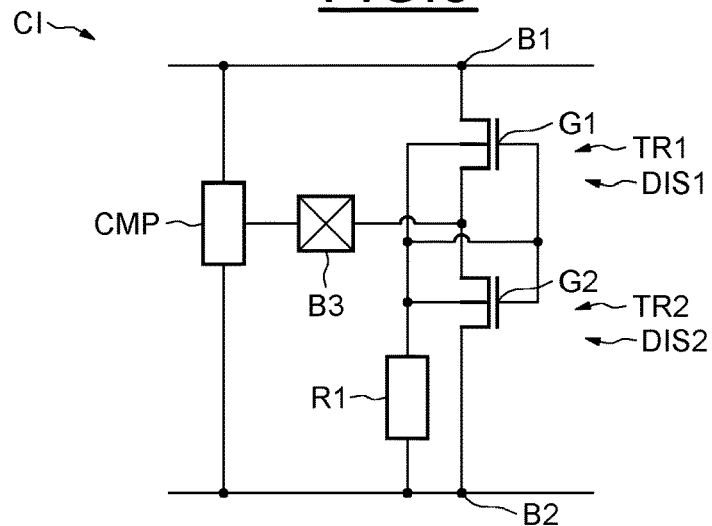

According to an embodiment illustrated in FIG. 3, it would be possible for the gate G1 of the first transistor TR1 and the gate G2 of the second transistor TR2 to be coupled to the reference terminal via the common resistor R1.

Thus, each transistor has its gate and its substrate mutually connected.

This allows a hybrid operation of the MOS transistors TR1 and TR2.

In particular, the common resistor R1 and the drain-gate capacitor of the first MOS transistor TR1 form a first trigger resistive-capacitive element making it possible to transmit the electrostatic pulse onto the gate of the first MOS transistor TR1. Thus, in the presence of an electrostatic discharge at the terminals of the first MOS transistor TR1, the electrostatic pulse will be transmitted both onto the gate G1 via drain-gate or source-gate capacitors, and onto the substrate sb1 of the first MOS transistor TR1 by the breakdown of the drain-substrate or source-substrate junction.

Similarly, the common resistor R1 and the drain-gate capacitor of the second MOS transistor TR2 form a first trigger resistive-capacitive element making it possible to transmit the electrostatic pulse onto the gate of the second MOS transistor TR2. Thus, in the presence of an electrostatic discharge at the terminals of the second MOS transistor TR2, the electrostatic pulse will be transmitted both onto the gate G2 via drain-gate or source-gate capacitors, and onto the substrate sb2 of the second MOS transistor TR2 by the breakdown of the drain-substrate or source-substrate junction.

In addition, the presence of the connection between the gate and the substrate of each transistor allows the gate to further polarize thereby amplifying the combined MOS and bipolar effects, since the nearer the gate voltage approaches the threshold voltage of the MOS transistor, the more the current gain increases.

This is particularly advantageous in the case of a pulse between the power supply terminal B1 and the signal terminal B3 where the trigger threshold is then lowered to 2.5 volts, and in the case of a pulse flowing from the signal terminal B3 to the reference terminal B2, where the threshold is lowered to 1.5 volts with respect to the embodiment previously described in connection with FIG. 2.

In this embodiment also, the connection of the substrate sb1 and of the gate G1 of the first transistor TR1, via the common resistor R1, to the reference terminal B2, i.e. to a different terminal from the signal terminal B3, makes it possible, when the device is in operation and, for example, the potential difference between the power supply terminal B1 and the signal terminal B3 is above the trigger threshold of the transistor TR1, to prevent the gate G1 of the first transistor TR1 from being polarized and the first transistor TR1 being triggered.

Figure 4:
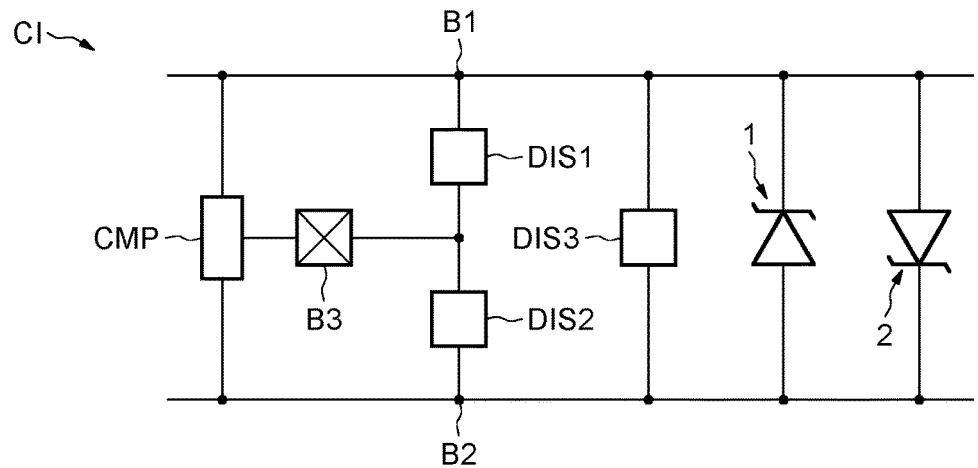
FIG. 4 is a schematic diagram of an electronic integrated circuit including electronic protection devices.
Figure 5:
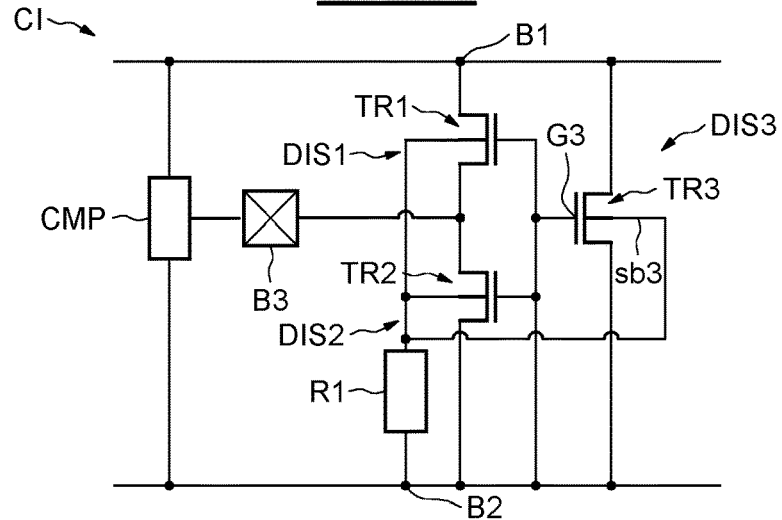
FIGS. 5 and 6 are schematic diagrams showing details of the electronic protection devices in FIG. 4.
Figure 6:
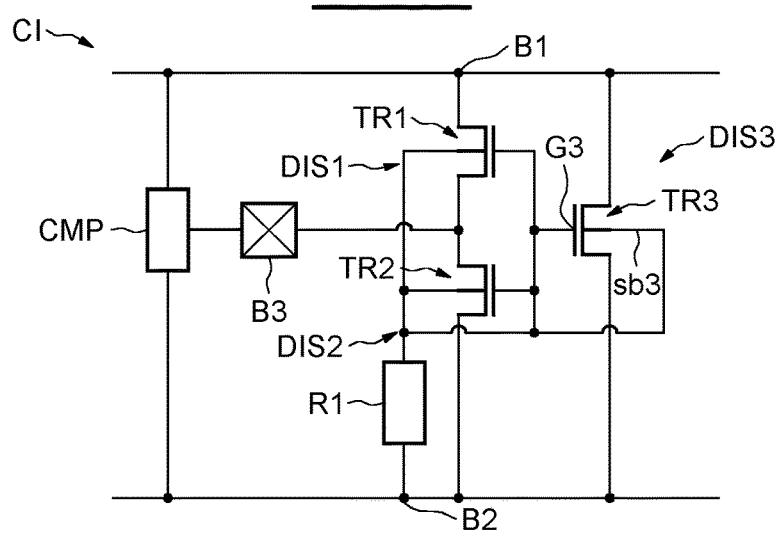

According to an embodiment illustrated by FIGS. 4 to 6, it is also possible to couple a third protection device DIS3 between the power supply terminal B1 and the reference terminal B2.

This device comprises a third transistor TR3, the gate G3 of which may be directly (FIG. 5) or indirectly connected to the reference terminal via the common resistor R1 (FIG. 6).

Thus, according to the embodiment illustrated in FIG. 5, in the presence of an electrostatic discharge flowing from the power supply terminal B1 to the reference terminal B2, the voltage generated by the current pulse increases until it reaches the breakdown voltage of the drain-substrate junction of the third MOS transistor TR3.

The substrate sb3, which corresponds here to the base of the parasitic bipolar transistor of the third MOS transistor TR3, is therefore polarized and the parasitic bipolar transistor is switched on.

The third transistor TR3 has a GGNMOS type configuration, and the reference terminal B2, to which the gate G3 of the third MOS transistor TR3 is connected, acts as a ground.

Here, the transistor is triggered for a voltage at its terminals equal to 4.2 volts.

And, the propagation path of the electrostatic discharge is more direct than if the discharge were flowing from the power supply terminal B1 to the reference terminal B2 via the first transistor TR1 and the second MOS transistor TR2, which makes it possible to prevent the presence of surges due to the current pulse flowing through the two transistors the resistive value of which is not zero.

In the presence of an electrostatic discharge flowing from the reference terminal B2 to the power supply terminal B1, the current pulse is transmitted by the common resistor R1 onto the substrate sb3 of the third MOS transistor TR3, and by the direct connection onto the gate G3 of the MOS transistor TR3.

In this scenario, the third transistor TR3 is triggered in the usual way, as soon as its gate-source voltage exceeds its threshold voltage.

The polarization of the substrate sb3 of the third MOS transistor TR3 makes it possible to lower the threshold voltage of the third transistor TR3. Here, the third MOS transistor TR3 is triggered for a voltage of 0.6 volts. In this case also, the propagation path is more direct than if the pulse were flowing between the reference terminal B2 and the power supply terminal B1 via the first MOS transistor TR1 and the second MOS transistor TR2.

According to the embodiment illustrated in FIG. 6, the trigger threshold of the third MOS transistor TR3 is lowered to 1.5 volts in the case of a discharge flowing from the power supply terminal B1 to the reference terminal B2.

In the case of an electrostatic discharge flowing from the reference terminal B2 to the power supply terminal B1, the current passing through the transistor increases linearly until the voltage at its terminals reaches 1.5 volts, then exponentially beyond 2.5 volts, while the voltage at these terminals approaches 3.5 volts asymptotically.

The circuit CI is thus protected against electrostatic discharge flowing between the power supply terminal B1 and the reference terminal B2.

Whatever the embodiment, the protection devices DIS1, DIS2 and DIS3 may be implemented in parallel with the existing protection devices, e.g. diodes or thyristors.

Thus, in FIG. 4, two thyristors 1 and 2 mounted head to tail are coupled between the power supply terminal B1 and the reference terminal B2.

The implementation of the protection devices DIS1, DIS2 and DIS3 is therefore compatible with the existing production processes comprising the implementation of other protection means. In this case, the existing devices may either operate in parallel with the devices DIS1, DIS2 and/or DIS3, or be inhibited by the devices DIS1, DIS2, and/or DIS3.

Figure 7:
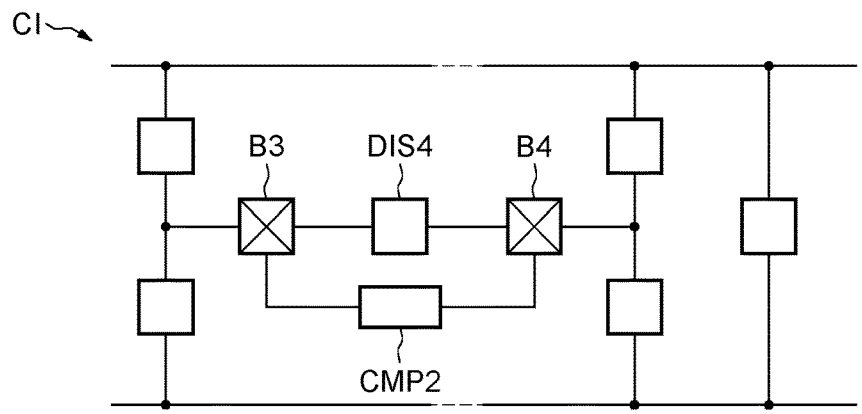
FIG. 7 is a schematic diagram of an electronic integrated circuit including electronic protection devices.
Figure 8:
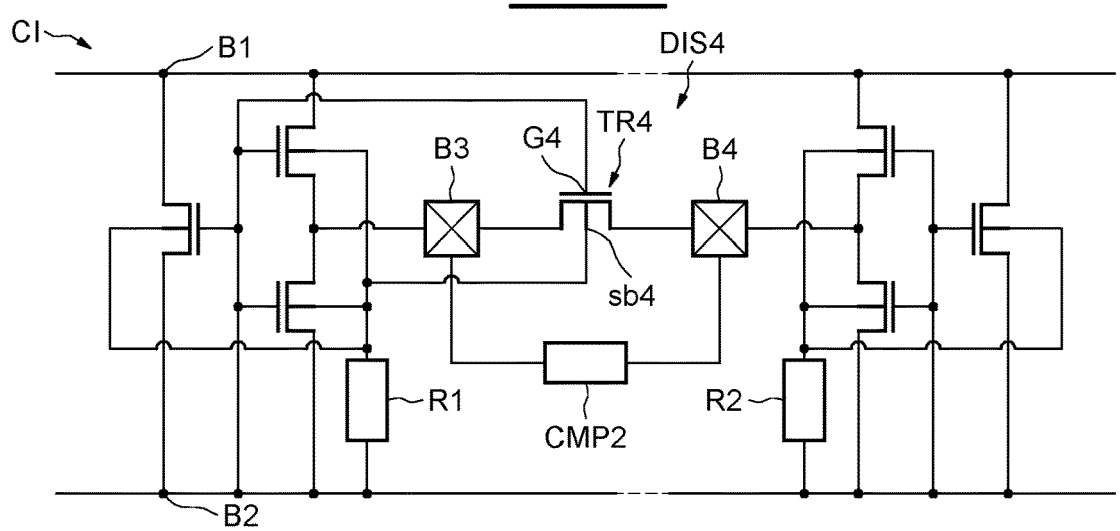
FIGS. 8 and 9 are schematic diagrams showing details of the electronic protection devices in FIG. 7.
Figure 9:
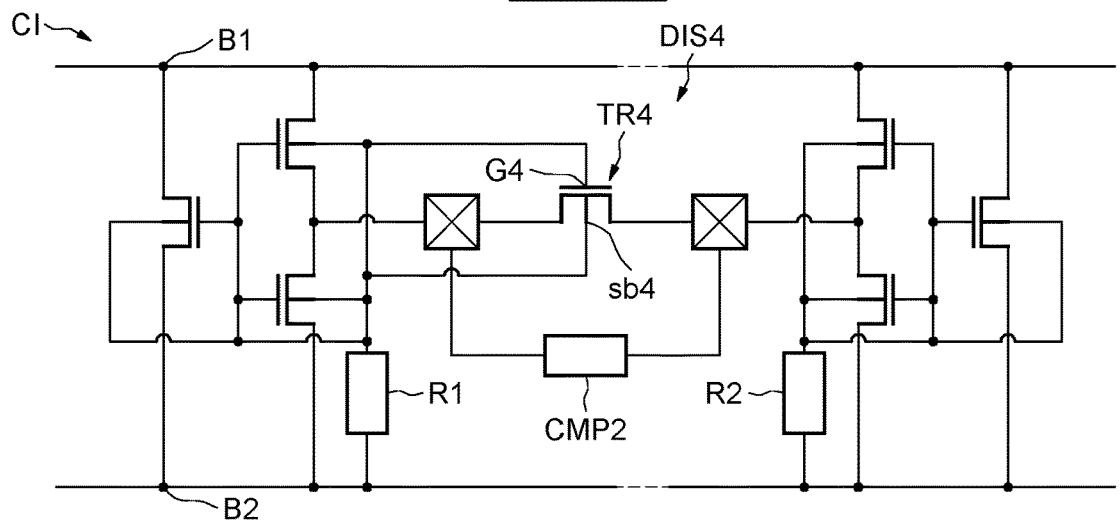

It would be possible, as illustrated in FIGS. 7 to 9, for the integrated circuit CI to include a plurality of signal terminals, a first signal terminal B3 and a second signal terminal B4 which would be indirectly connected via an electronic module CMP2.

In the presence of an electrostatic discharge between the first signal terminal B3 and the second signal terminal B4, it is advisable that this current pulse should flow through a protection device and not through the electronic module CMP2.

Thus, the integrated circuit CI comprises a fourth protection device DIS4 coupled between the first signal terminal B3 and the second signal terminal B4.

As illustrated in FIG. 8, the fourth protection device may comprise a fourth MOS transistor TR4, the gate G4 of which is directly coupled to the reference terminal B2, and the substrate sb4 of which is coupled to the reference terminal via the common resistor R1.

It would, however, be possible for the substrate sb4 of the intermediate transistor TR4 to be coupled to the second signal terminal B4 via the common resistor R2 to the protection circuits associated with the second signal terminal B4.

The fourth transistor TR4 here has a GGNMOS type configuration.

In the presence of an electrostatic discharge between the first signal terminal B3 and the second signal terminal B4, the voltage generated by the current pulse increases until it reaches the breakdown voltage of the drain-substrate junction of the fourth MOS transistor TR4.

The substrate sb4, which corresponds here to the base of the parasitic bipolar transistor of the fourth MOS transistor TR4, is therefore polarized and the parasitic bipolar transistor of the fourth transistor TR4 is switched on.

According to a variant illustrated in FIG. 9, it would be possible for the intermediate transistor TR4 to be a transistor in a configuration allowing a hybrid operation, having its gate G4 and its substrate sb4 directly mutually connected and coupled to the reference terminal B2 via the common resistor R1.

This configuration makes it possible to further improve the triggering of the fourth transistor TR4.

Figure 10:
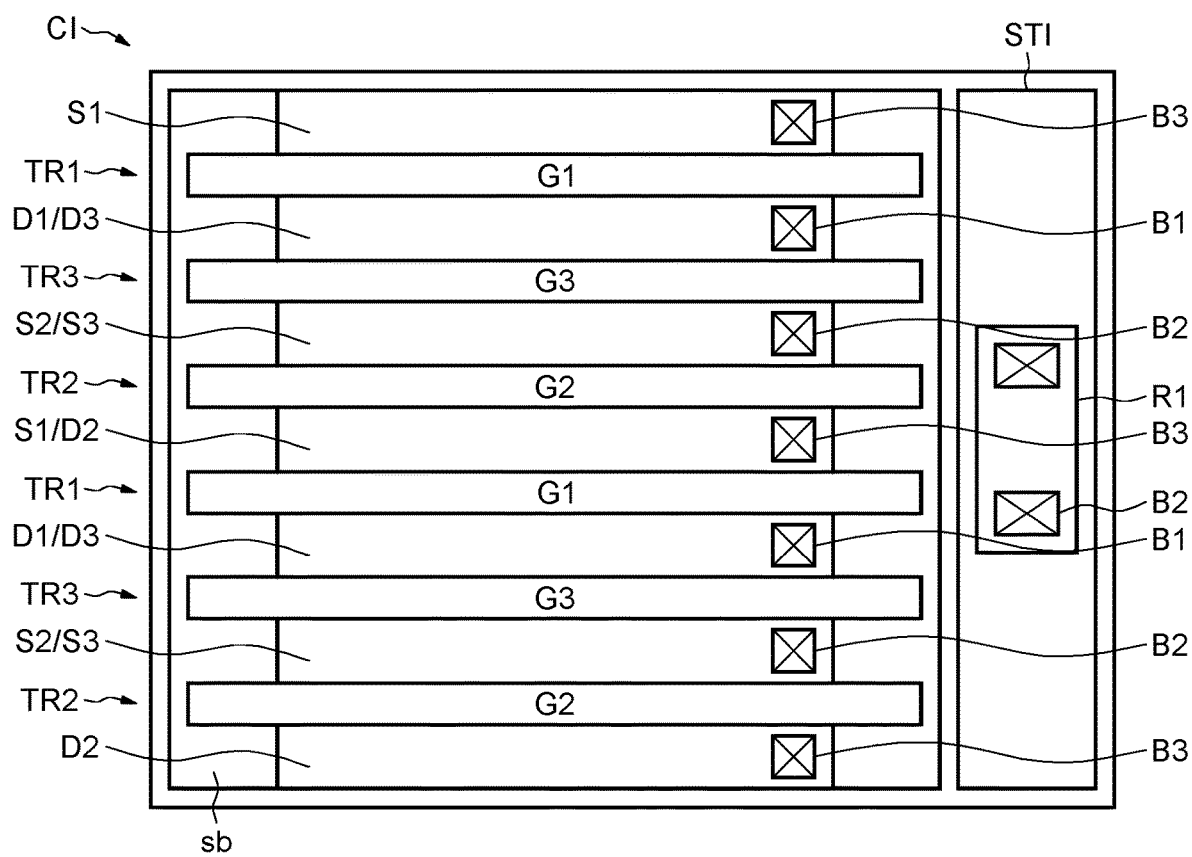
FIG. 10 illustrates a top view of an integrated circuit.

FIG. 10 illustrates a top view of an integrated circuit CI comprising the first transistor TR1, the second transistor TR2, the third transistor TR3, and the common resistor R1 according to the embodiment previously described in connection with FIG. 5.

The three transistors are implemented on one and the same substrate sb, delimited by an isolating trench STI and are implemented so as to share at least one of their electrodes.

In this embodiment, each transistor is duplicated, i.e. it actually comprises two identical transistors mounted in parallel. This is equivalent to one larger-sized transistor, which makes it possible to support the passage of the current pulse resulting from an electrostatic discharge.

However, each transistor could include any number of identical transistors mounted in parallel, the greater the number of identical transistors the larger being the size of the equivalent transistor.

Thus, the drain D1 of the first transistor TR1 and the drain D3 of the third transistor TR3 are merged and connected to the power supply terminal B1 via vias and metal tracks, the source S3 of the third transistor TR3 and the source S2 of the second transistor TR2 are merged and connected to the reference terminal B2 via vias and metal tracks, the source S1 of the first transistor TR1 and the drain D2 of the second transistor TR2 are merged and connected to the signal terminal B3.

The gates G1, G2 and G3 are mutually connected and coupled to the second terminal B2 via vias and metal tracks. However, they could be connected to the common resistor R1 via vias and metal tracks.

The substrate of each transistor is coupled to the common resistor R1 via vias and metal tracks.

Thus, a particularly compact ESD protection system is obtained.

The substrate may be a bulk substrate or a silicon on insulator (SOI) substrate.

The invention claimed is:

1. An integrated circuit, comprising:
a power supply terminal;
a reference terminal;
a first signal terminal;
a second signal terminal;
a first protection device coupled between the first signal terminal and the power supply terminal;
a second protection device coupled between the first signal terminal and the reference terminal;
a third protection device coupled between the second signal terminal and the power supply terminal;
a fourth protection device coupled between the second signal terminal and the reference terminal; and
a MOS protection transistor having a first electrode coupled to said signal terminal and a second electrode coupled to said second signal terminal, wherein a gate of the MOS protection transistor is indirectly coupled to the reference terminal, and a substrate of the MOS protection transistor is coupled to the reference terminal via a first common resistor.

2. The integrated circuit according to claim 1, wherein the gate of the MOS protection transistor is coupled to the reference terminal via a first trigger circuit.

3. The integrated circuit according to claim 2, wherein the first trigger circuit includes the first common resistor.

4. The integrated circuit of claim 1, wherein the gate of the MOS protection transistor is coupled to the reference terminal via said first common resistor.

5. The integrated circuit of claim 1:
wherein the first protection device comprises a first MOS transistor having a first electrode coupled to the first signal terminal and a second electrode coupled to the power supply terminal,
wherein the second protection device comprises a second MOS transistor having a first electrode coupled to said first signal terminal and a second electrode coupled to the reference terminal,
wherein gates of the first and second MOS transistors, substrates of the first and second MOS transistors and the substrate of the MOS protection transistor are connected to a first terminal of the first common resistor, and wherein a second terminal of the first common resistor is connected to the reference terminal.

6. The integrated circuit according to claim 5, wherein the first and second MOS transistors and the MOS protection transistor are implemented in one and the same substrate and have mutually connected gates.

7. The integrated circuit according to claim 5, wherein the first and second MOS transistors are implemented in one and the same substrate and have mutually connected gates.

8. The integrated circuit according to claim 5, further comprising a third MOS transistor having a first electrode coupled to the power supply terminal, a second electrode coupled to the reference terminal, a gate indirectly connected to the reference terminal and a substrate connected to the first terminal of the first common resistor.

9. The integrated circuit according to claim 8, wherein the first, second and third MOS transistors are implemented in one and the same substrate and have mutually connected gates.

10. The integrated circuit according to claim 8, wherein the gate of the third MOS transistor is coupled to the reference terminal via said first common resistor.

11. The integrated circuit according to claim 5, wherein the gates of the first and second MOS transistors and the MOS protection transistor are coupled to the reference terminal via a first trigger circuit.

12. The integrated circuit according to claim 11, wherein the first trigger circuit includes the first common resistor.

13. The integrated circuit of claim 1:
wherein the third protection device comprises a fourth MOS transistor having a first electrode coupled to the second signal terminal and a second electrode coupled to the power supply terminal, wherein the fourth protection device comprises a fifth MOS transistor having a first electrode coupled to said second signal terminal and a second electrode coupled to the reference terminal, wherein gates of the fourth and fifth MOS transistors and substrates of the fourth and fifth MOS transistors are connected to a first terminal of the second common resistor, and wherein a second terminal of the second common resistor is connected to the reference terminal.

14. The integrated circuit according to claim 13, wherein the fourth and fifth MOS transistors are implemented in one and the same substrate and have mutually connected gates.

15. The integrated circuit according to claim 13, further comprising a sixth MOS transistor having a first electrode coupled to the power supply terminal, a second electrode coupled to the reference terminal, a gate indirectly connected to the reference terminal and a substrate connected to the first terminal of the second common resistor.

16. The integrated circuit according to claim 15, wherein the fourth, fifth and sixth MOS transistors are implemented in one and the same substrate and have mutually connected gates.

17. The integrated circuit according to claim 15, wherein the gate of the sixth MOS transistor is coupled to the reference terminal via said second common resistor.

18. The integrated circuit according to claim 13, wherein the gates of the fourth and fifth MOS transistors are coupled to the reference terminal via a second trigger circuit.

19. The integrated circuit according to claim 18, wherein the second trigger circuit includes the second common resistor.

20. The integrated circuit according to claim 1, further comprising an electronic module that electrically interconnects the first and second signal terminals.

* * * * *